(12) United States Patent
Zhang et al.

(10) Patent No.: US 7,876,600 B2
(45) Date of Patent: Jan. 25, 2011

(54) SRAM AND METHOD OF CONTROLLING THE SRAM

(75) Inventors: Jin-Feng Zhang, Jiangsu Province (CN);
Jian-Bin Zheng, Jiangsu Province (CN);
Zhao-Yong Zhang, Jiangsu Province (CN); Qi-Shuang Yao, Jiangsu Province (CN)

(73) Assignee: Aicestar Technology (SuZhou) Corporation, Soochow (CN)

( * ) Notice: Subject to any disclaimer, the term of this patent is extended or adjusted under 35 U.S.C. 154(b) by 164 days.

(21) Appl. No.: 12/272,701

(22) Filed: Nov. 17, 2008

(65) Prior Publication Data

US 2010/0124098 A1    May 20, 2010

(51) Int. Cl.
G11C 11/00 (2006.01)
(52) U.S. Cl. .................... 365/154; 365/226; 365/189.06
(58) Field of Classification Search .................. 365/154, 365/226, 189.06; 29/592.1
See application file for complete search history.

(56) References Cited

U.S. PATENT DOCUMENTS

| | | | | |
|---|---|---|---|---|
| 5,325,337 A | * | 6/1994 | Buttar | 365/203 |
| 7,301,840 B2 | * | 11/2007 | Yamagami | 365/210.1 |
| 7,577,014 B2 | * | 8/2009 | Yamagami | 365/154 |
| 7,586,806 B2 | * | 9/2009 | Wong | 365/226 |
| 2006/0067134 A1 | | 3/2006 | Zhang et al. | |
| 2006/0262628 A1 | | 11/2006 | Nii et al. | |
| 2007/0030741 A1 | | 2/2007 | Nii et al. | |

OTHER PUBLICATIONS

Shigeki Ohbayashi et al., "A 65-nm SoC Embedded 6T-SRAM Designed for Manufacturability with Read and Write Operation Stabilizing Circuits," IEEE Journal of Solid-State Circuits, vol. 42, No. 4, Apr. 2007, pp. 820-829.

\* cited by examiner

*Primary Examiner*—VanThu Nguyen
(74) *Attorney, Agent, or Firm*—Jianq Chyun IP Office

(57) ABSTRACT

An SRAM and a forming method and a controlling method thereof are provided. The above-mentioned SRAM includes a tracking column, a normal column, a cell voltage control circuit and a cell voltage pull-down circuit. Each of the tracking column and the normal column includes a plurality of memory cells. The cell voltage control circuit is coupled to the tracking column and the normal column for connecting an operation voltage to the two columns before a write operation of the SRAM starts and for disconnecting the operation voltage from the two columns after the write operation starts. The cell voltage pull-down circuit is coupled to the two columns for pulling down the cell voltages of the two columns after the write operation starts and for ceasing pulling down the cell voltage of the normal column when the cell voltage of the tracking column drops down to a predetermined voltage.

17 Claims, 9 Drawing Sheets

US 7,876,600 B2

SRAM AND METHOD OF CONTROLLING THE SRAM

BACKGROUND OF THE INVENTION

1. Field of the Invention

The present invention generally relates to a static random access memory (SRAM), and more particularly, to a write operation of an SRAM.

2. Description of Related Art

Since the CMOS process reaches 65 nanometer level, the stability of an SRAM becomes challenged. Since the minimal dimension of a transistor is difficult to be controlled precisely and stochastic doping fluctuation has more significant influence with the process accuracy, the threshold of a transistor is easily varied, which causes a great negative impact on the write margin of the memory cells of an SRAM.

FIG. 1 is a circuit diagram of a memory cell of an SRAM, where the memory cell is a latch comprising two inverters, and the two inverters must be inverted during a write operation. In particular, during a write operation of the memory cell, the transistors PU and TG and the bit line BL together form a voltage-dividing circuit which has an equivalent circuit shown by FIG. 2. Referring to FIGS. 1 and 2, if the width and length of the above-mentioned transistors are varied or a stochastic doping fluctuation occurs so that the threshold of the transistor PU is reduced and/or the threshold of the transistor TG is increased, the voltage of the node nv1 is increased, which has a negative impact on inverting the inverters and reduces the write margin.

Referring to FIGS. 3 and 4, FIG. 3 is a signal timing diagram of the voltages of the word line WL and two nodes nv0 and nv1 of the memory cell in FIG. 1 as a write operation succeeds, wherein the voltages of the nodes nv0 and nv1 clearly indicate the two inverters are inverted during the effective duration of the word line voltage thereof and the write operation of data succeeds. FIG. 4 is a signal timing diagram showing the memory cell in FIG. 1 has a failed write operation, where due to the decreased write margin, the inverters are unable to be inverted during the effective duration of the word line voltage thereof so as to result in a failed write operation of data. Once a write operation fails, the SRAM exhibits unreliable performance, which is not allowable for computer applications.

There are several schemes today to increase the write margin of a memory cell. The above-mentioned schemes have a common feature of reducing the memory cell voltage during a write operation to increase the write margin. Referring to the voltage-dividing circuit of FIG. 2, reducing the cell voltage VDD below the turn-on voltage of the word line WL during a write operation can increase the equivalent resistance of the transistor PU when PU is turned on and thereby reduce the voltage of the node nv1, which facilitate to invert the two inverters. The conventional schemes for increasing the write margin are depicted as follows.

FIG. 5 is the circuit diagram provided by K. Zhang in his US Patent Application Publication No. 2006/0067134. The circuit is based on an idea of dual power supplies, where the high power voltage VDD_HI of a power supply circuit 501 is selected as the memory cell voltage during a read operation, and the low power voltage VDD_LOW of the power supply circuit 502 is selected as the memory cell voltage during a write operation. The circuit is disadvantageous in complexity of the circuit design and the timing control, because the scheme requires switching the circuit between the high power voltage VDD_HI and the low power voltage VDD_LOW corresponding to the read and write operations. Therefore, it is difficult to control the voltage stably. In addition, VDD_HI and VDD_LOW are fixed voltages and not varied with the fluctuation of the operation voltage VDD, so that the circuit is not suitable for an operation voltage VDD with larger fluctuation range.

FIG. 6 is a circuit diagram provided by RENESAS Technology Corp. in US Patent Application Publication No. 2006/0262628. The circuit is based on an idea of floating column voltage. During a write operation, the complementary voltage levels of the bit lines BL and BLB would turn off the p-channel metal oxide semiconductor field effect transistor (P-MOSFET) 603 for controlling the cell voltage VDD through an NAND gate 602 so as to float the cell power line 601. Moreover during the write operation, the n-channel metal oxide semiconductor field effect transistor (N-MOSFET) 604 is turned on, so that the charges on the cell power line 601 flow into the bit line BL along the dotted line direction shown in FIG. 6. The circuit is not suitable for a too long memory cell column (i.e., a memory column with many memory cell) because the length of the bit line affects its capacitance (e.g., capacitance of the cell power line 601). Excessive capacitance caused by the too long bit line lessens the reduction of the cell voltage and restricts the improvement of the write margin.

FIG. 7 is a circuit diagram provided by RENESAS Technology Corp. in the paper "*A 65-nm SoC Embedded 6T-SRAM Designed for Manufacturability with Read and Write Operation Stabilizing Circuits*". The circuit is based on an idea of charge sharing for reducing the cell voltage, wherein in addition to the cell power line 701 which a memory cell column usually contains, the circuit further employs an additional metal line 702. During a write operation, the P-MOSFET 703 for controlling the cell voltage VDD is turned off and the N-MOSFET 704 is turned on, so that the charges on the cell power line 701 flow into the additional metal line 702 along the dotted line direction shown in FIG. 7 to reduce the cell voltage. The circuit has a disadvantage that the reduction of the cell voltage is hard to be precisely controlled because the reduction of the cell voltage depends on a ratio of the capacitances of the cell power line 701 vs. that of the additional metal line 702. The capacitances of the conductive lines are difficult to be precisely matched with each other, which affects the accuracy of the reduction of the cell voltage.

SUMMARY OF THE INVENTION

Accordingly, the present invention is directed to an SRAM and a forming method and a controlling method thereof, which are able to reduce the memory cell voltage during a write operation to increase the write margin without all the above-mentioned disadvantages of the prior art.

The present invention provides an SRAM, which includes a tracking column, a normal column, a cell voltage control circuit and a cell voltage pull-down circuit. The tracking column includes a plurality of first memory cells and the normal column includes a plurality of second memory cells. The cell voltage control circuit is coupled to the tracking column and the normal column for connecting an operation voltage to the tracking column and the normal column before a write operation of the SRAM starts and disconnecting the operation voltage from the tracking column and the normal column after the write operation starts. The cell voltage pull-down circuit is coupled to the tracking column and the normal column for pulling down the cell voltages of the tracking column and the normal column after the write operation starts and for ceasing pulling down the cell voltages of the normal column when the cell voltage of the tracking column drops down to a predetermined voltage.

In an embodiment of the present invention, the above-mentioned tracking column includes a first cell power line and the above-mentioned first memory cells receive their cell voltage from the first cell power line. The normal column includes a second cell power line and the above-mentioned second memory cells receive their cell voltage from the second cell power line. The cell voltage control circuit is coupled to the first cell power line and the second cell power line, and the cell voltage pull-down circuit is also coupled to the first cell power line and the second cell power line.

In an embodiment of the present invention, the above-mentioned tracking column and normal column have an identical structure.

In an embodiment of the present invention, the above-mentioned cell voltage control circuit includes a first switch and a second switch, wherein the first switch is coupled between the operation voltage and the tracking column to be turned on or turned off according to a global write enable signal; the second switch is coupled between the operation voltage and the normal column to be turned on or turned off according to the global write enable signal.

In another embodiment of the present invention, the above-mentioned cell voltage control circuit includes a first switch and a second switch, wherein the first switch is coupled between the operation voltage and the tracking column to be turned on or turned off according to a global write enable signal; the second switch is coupled between the operation voltage and the normal column to be turned on or turned off according to a column write enable signal.

In an embodiment of the present invention, the above-mentioned first switch and second switch are PMOS FETs, and the global write enable signal and the column write enable signal rise from a logic-low level to a logic-high level when the write operation starts and drop down from the logic-high level to the logic-low level after the write operation is completed.

In an embodiment of the present invention, the cell voltage pull-down circuit includes a third switch, a fourth switch and a detector. The third switch is coupled between the tracking column and a ground voltage to be turned on or turned off according to a global write enable signal. The fourth switch is coupled between the normal column and the ground voltage. The detector is coupled between the tracking column and the fourth switch to turn on or turn off the fourth switch according to the cell voltage of the tracking column.

In an embodiment of the present invention, the above-mentioned predetermined voltage is proportional to the operation voltage with a predetermined ratio, and the current-driving capacity of the third switch is proportional to the current-driving capacity of the fourth switch with another predetermined ratio.

In an embodiment of the present invention, the above-mentioned third switch and fourth switch are N-MOSFETs.

In an embodiment of the present invention, the above-mentioned detector turns on the fourth switch before the cell voltage of the tracking column drops down to the predetermined voltage and turns off the fourth switch after the cell voltage of the tracking column drops down to the predetermined voltage.

In an embodiment of the present invention, the above-mentioned detector is an AND gate having a first input terminal, a second input terminal and an output terminal. The first input terminal is coupled to the tracking column for receiving the cell voltage of the tracking column. The second input terminal receives a column write enable signal. The output terminal is coupled to the fourth switch for turning on or turning off the fourth switch. The above-mentioned predetermined voltage is the output inverting voltage of the AND gate.

In an embodiment of the present invention, the cell voltage pull-down circuit further includes a buffer, which is coupled between the tracking column and the detector for increasing the capacity of cell voltage of the tracking column for driving the detector.

The present invention also provides a method of forming an SRAM (for example, a method for designing or producing an SRAM). The forming method includes: providing a tracking column including a plurality of first memory cells; providing a normal column including a plurality of second memory cells; providing a cell voltage control circuit coupled to the tracking column and the normal column for connecting an operation voltage to the tracking column and the normal column before a write operation of the SRAM starts and for disconnecting the operation voltage from the tracking column and the normal column after the write operation starts; and providing a cell voltage pull-down circuit coupled to the tracking column and the normal column for pulling down the cell voltages of the tracking column and the normal column after the write operation starts and for ceasing pulling down the cell voltages of the normal column when the cell voltage of the tracking column drops down to a predetermined voltage. The forming method is applicable to a memory design means such as CAD (computer-aided design) program or so-called memory complier.

The present invention further provides a method of controlling an SRAM, wherein the SRAM includes at least a first column (for example, the above-mentioned tracking column) and a second column (for example, the above-mentioned normal column). Each of the first column and the second column has at least a memory cell and each of the memory cells operates according to a corresponding cell voltage. The method includes the following steps: as a write operation starts, disconnecting the cell voltage of each memory cell in the first column from an operation voltage with a fixed level so that the cell voltage of each memory cell in the first column starts changing; meanwhile disconnecting each memory cell in the second column from the operation voltage with the fixed level so that the cell voltage of each memory cell in the second column starts changing. When the cell voltage of the second column starts changing, the control method controls the variation of the cell voltage of the second column according to the variation of the cell voltage of the first column.

The present invention is able to increase the write margin of an SRAM fabricated by the advanced CMOS process and avoid the failure of write operations. The present invention utilizes a tracking column and a normal column which have identical structures and the ratio between the current-driving capacities of two switches to control the reduction of the cell voltage during a write operation. In this way, the present invention is suitable for a wider range of the operation voltage and SRAM architectures with bit lines of various lengths. Besides, the present invention can precisely adjust the amount of reduction of the SRAM cell voltage.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 2:
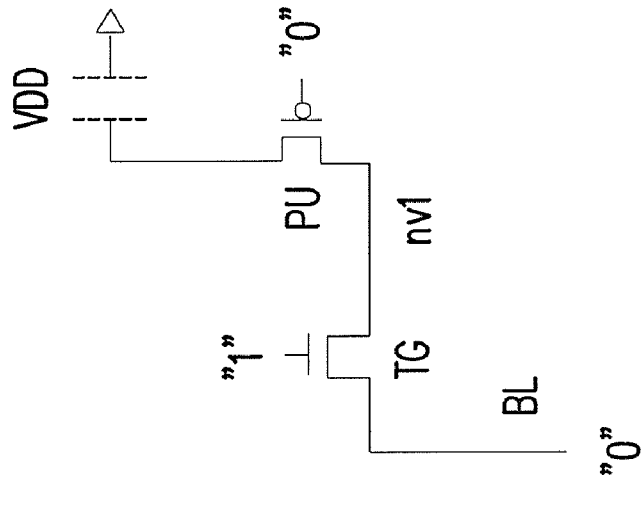
FIG. 2 is a schematic diagram of the voltage-dividing circuit of the memory cell in FIG. 1 during write operation.
Figure 1:
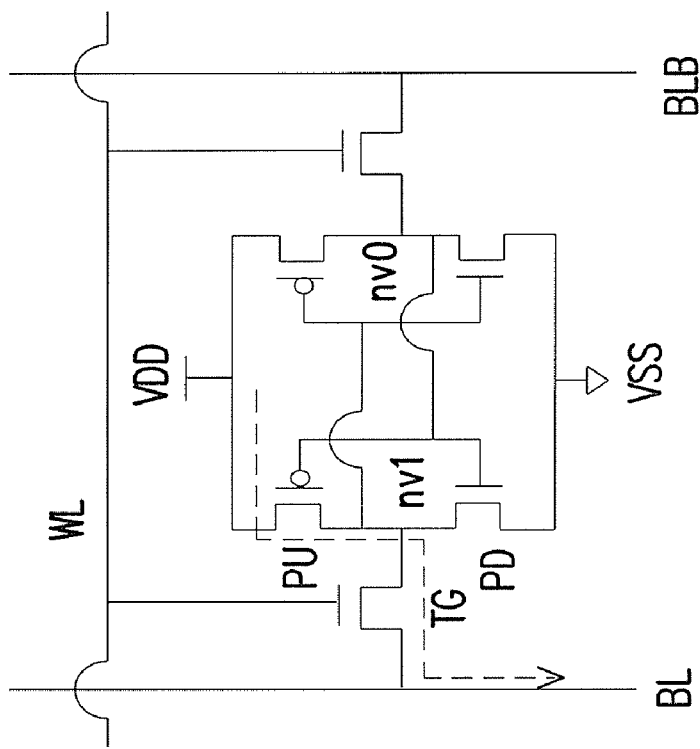
FIG. 1 is a circuit diagram of a memory cell of an SRAM.
Figures 3, 4:
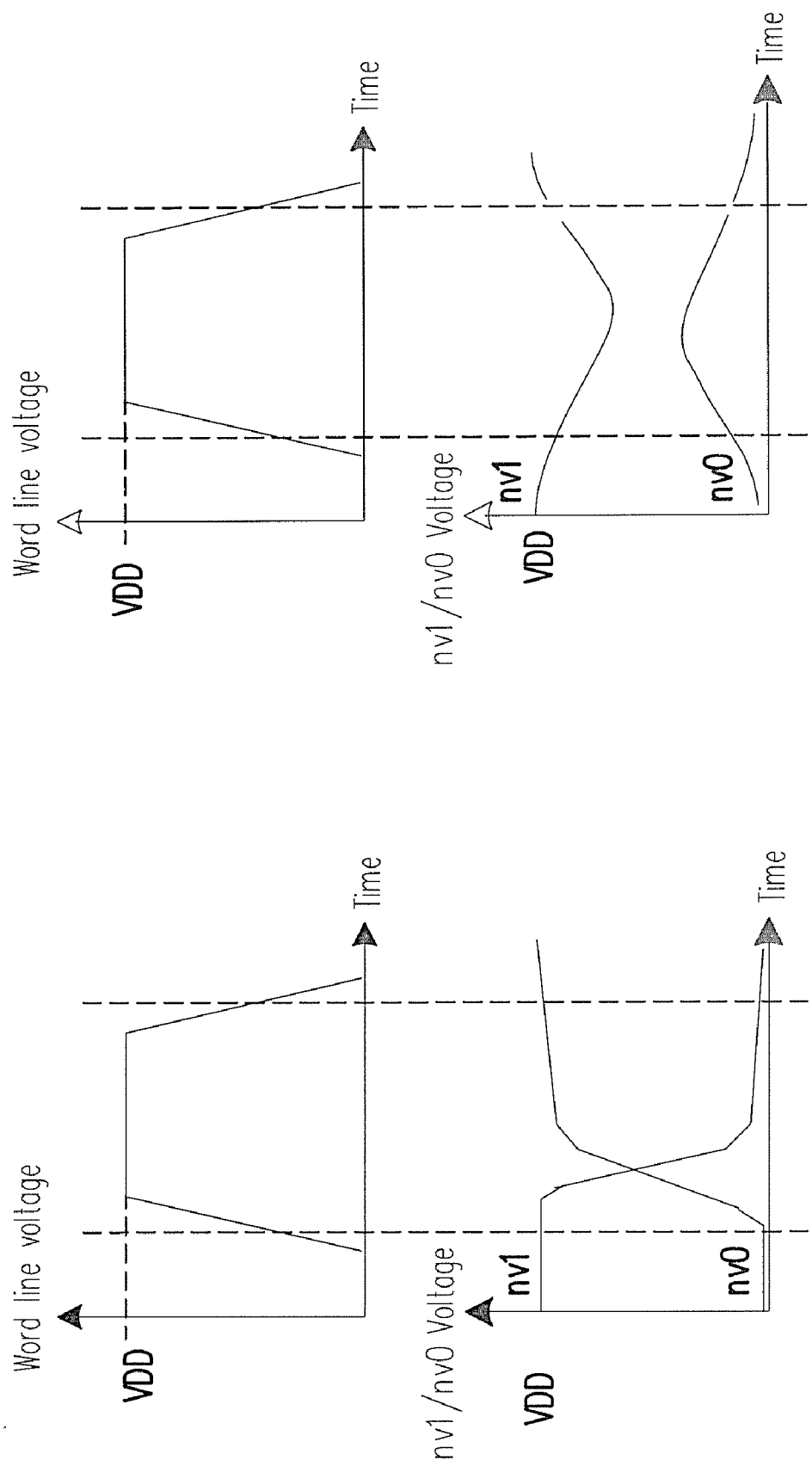
FIGS. 3 and 4 are two signal timing diagrams of the memory cell in FIG. 1 during write operation.
Figure 5:
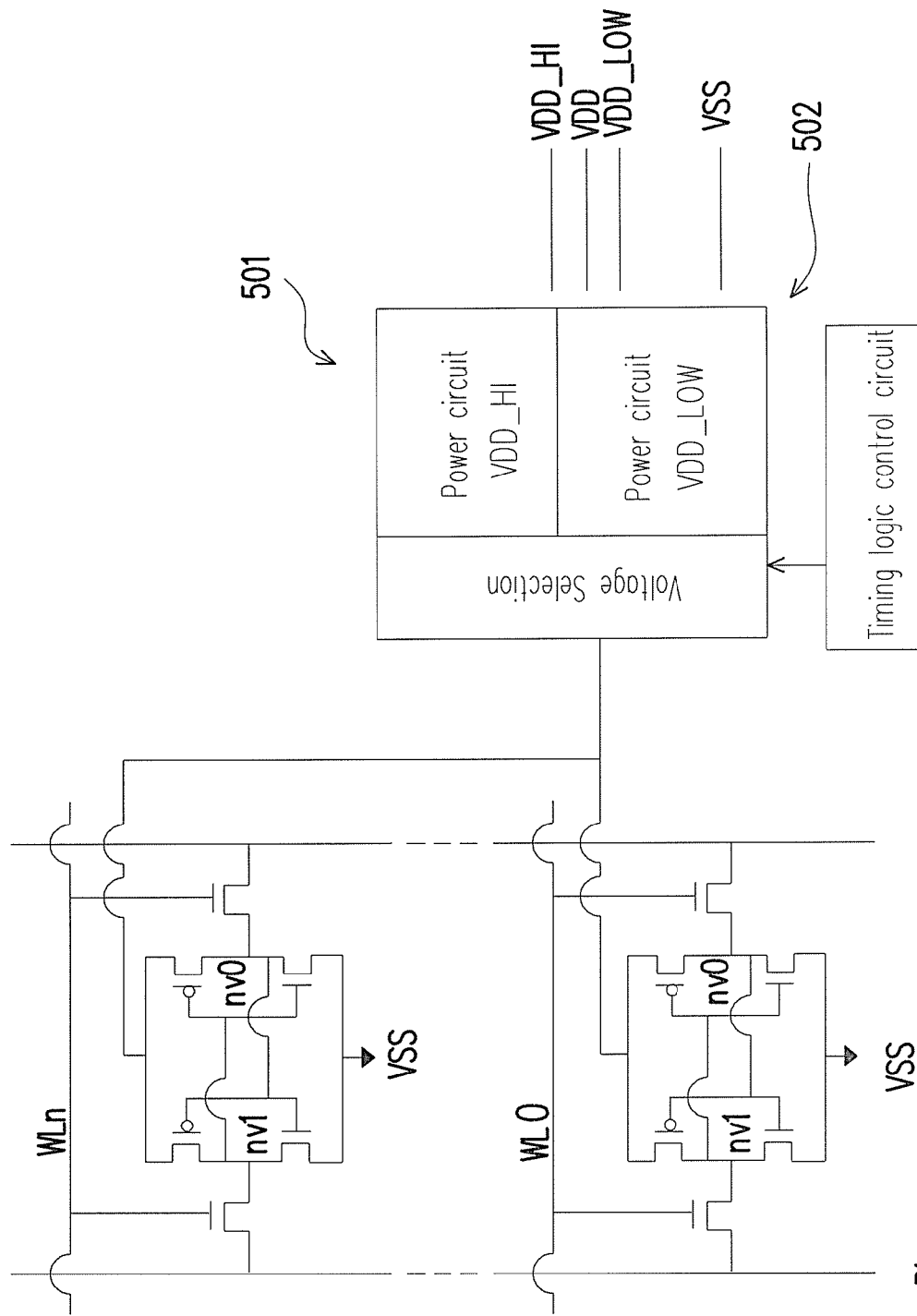
FIGS. 5-7 are circuit diagrams of conventional SRAMs capable of reducing memory cell voltage.
Figure 6:
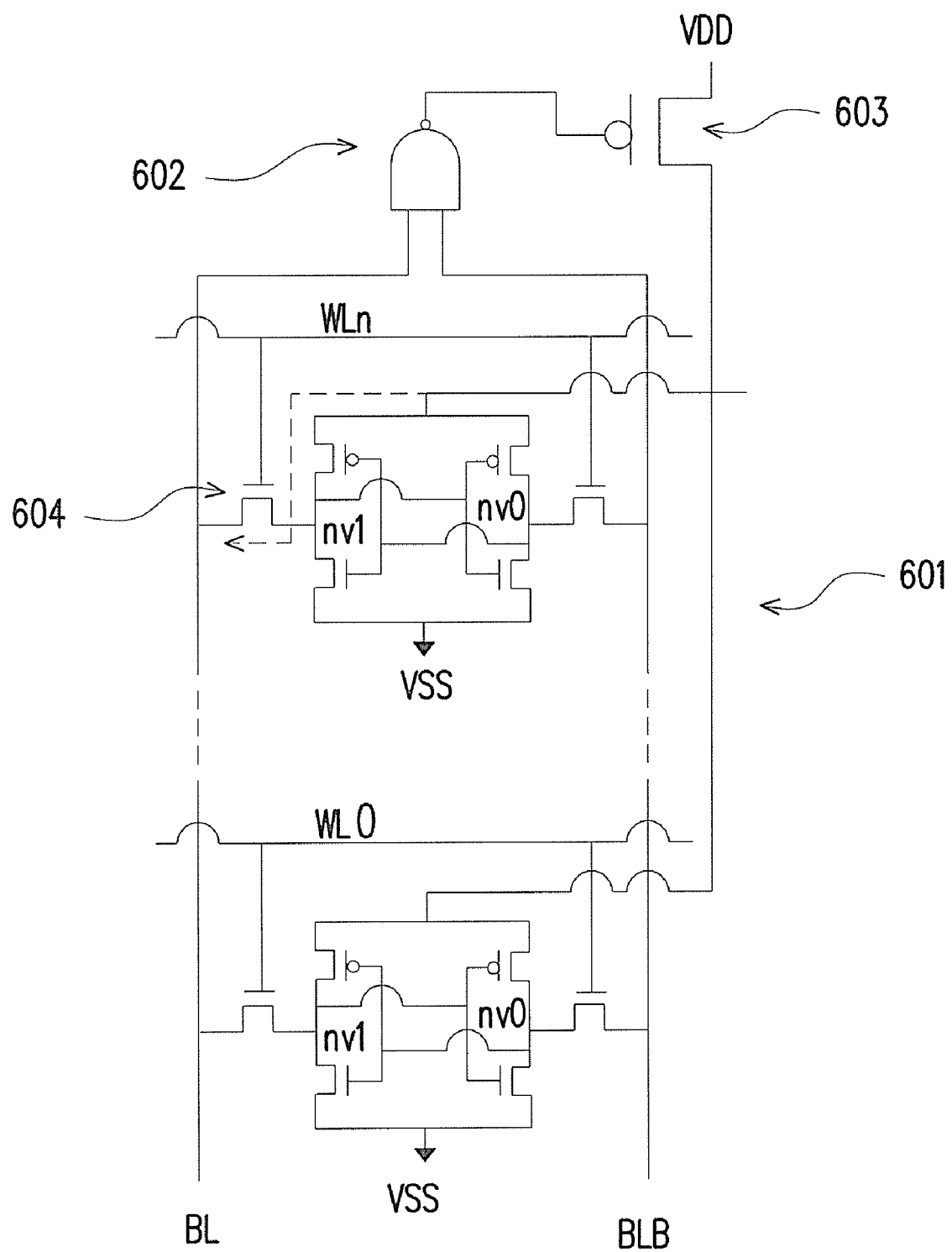
Figure 7:
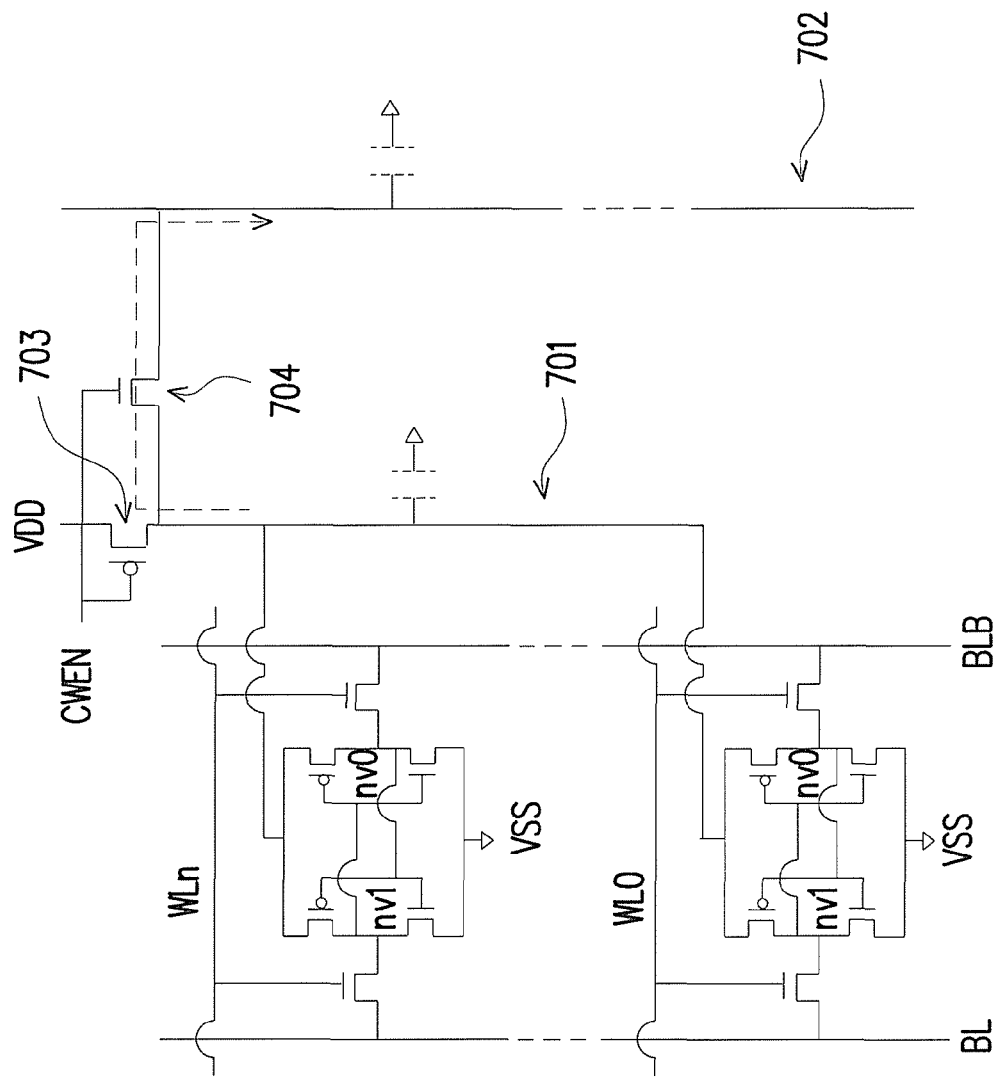

Reference will now be made in detail to the present preferred embodiments of the invention, examples of which are illustrated in the accompanying drawings. Wherever possible, the same reference numbers are used in the drawings and the description to refer to the same or like parts.

Figure 8:
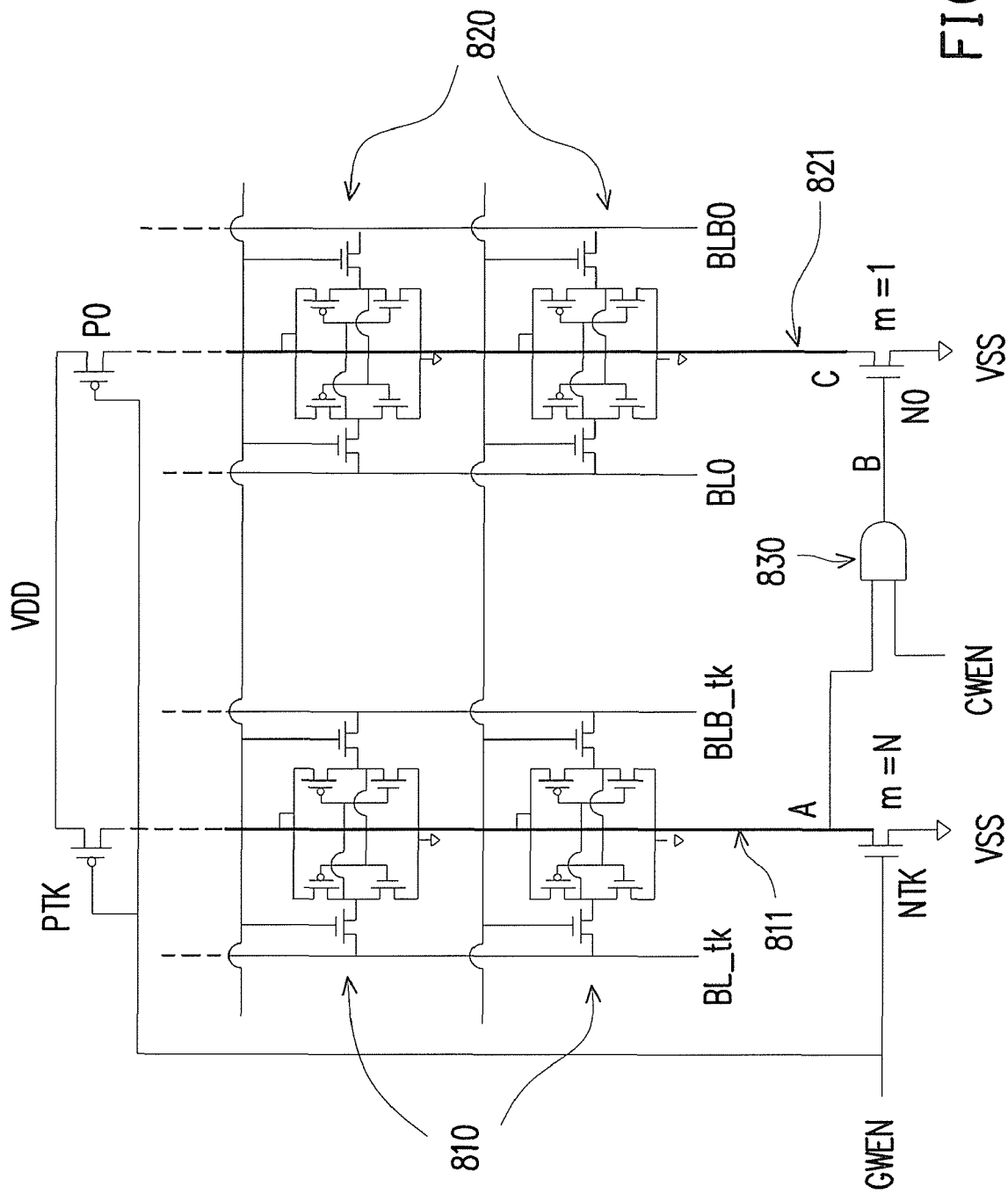
FIG. 8 is a diagram of a partial circuit of an SRAM according to an embodiment of the present invention.

FIG. 8 is a diagram of a partial circuit of an SRAM according to an embodiment of the present invention. An SRAM in FIG. 8 includes a tracking column 810, a normal column 820, two P-MOSFETs PTK and P0, two N-MOSFETs NTK and N0 and an AND gate 830. The tracking column 810 is designed specifically by the embodiment and has a specific function depicted later on. The tracking column 810 includes a cell power line 811 and a plurality of memory cells (two memory cells are shown in FIG. 8, which the present invention is not limited to). The memory cells of the tracking column 810 receive their cell voltage from the cell power line 811. The normal column 820 is for storing bit data and includes a cell power line 821 and a plurality of second memory cells (two memory cells are shown in FIG. 8, which the present invention is not limited to). The memory cells of the normal column 820 receive their cell voltage from the cell power line 821.

The P-MOSFET PTK is coupled between an operation voltage VDD and the cell power line 811, the P-MOSFET P0 is coupled between the operation voltage VDD and the cell power line 821, and N-MOSFET NTK is coupled between the cell power line 811 and a ground voltage VSS, wherein PTK, P0 and NTK are turned on or turned off according to a global write enable signal GWEN. The N-MOSFET N0 is coupled between the cell power line 821 and the ground voltage VSS and is turned on or turned off according to the output of the AND gate 830. In other embodiments of the present invention, PTK, P0, NTK and N0 can be replaced by other types of switches as long as the switches are able to be turned on or turned off in response to the corresponding control signals.

The AND gate 830 has two input terminals and an output terminal. The first input terminal is coupled to the cell power line 811 to receive the cell voltage of the tracking column 810. The second input terminal receives a column write enable signal CWEN. The output terminal is coupled to the N-MOSFET N0 to turn on or turn off the N-MOSFET N0.

FIG. 8 is designed purposely for reducing the cell voltage of the normal column 820. The tracking column 810 is a replica of the normal column 820, and the two memory cell columns have the identical structure, wherein the cell voltage of the normal column 820 can be reduced in synchronization following the cell voltage of the tracking column 810.

Figure 9:
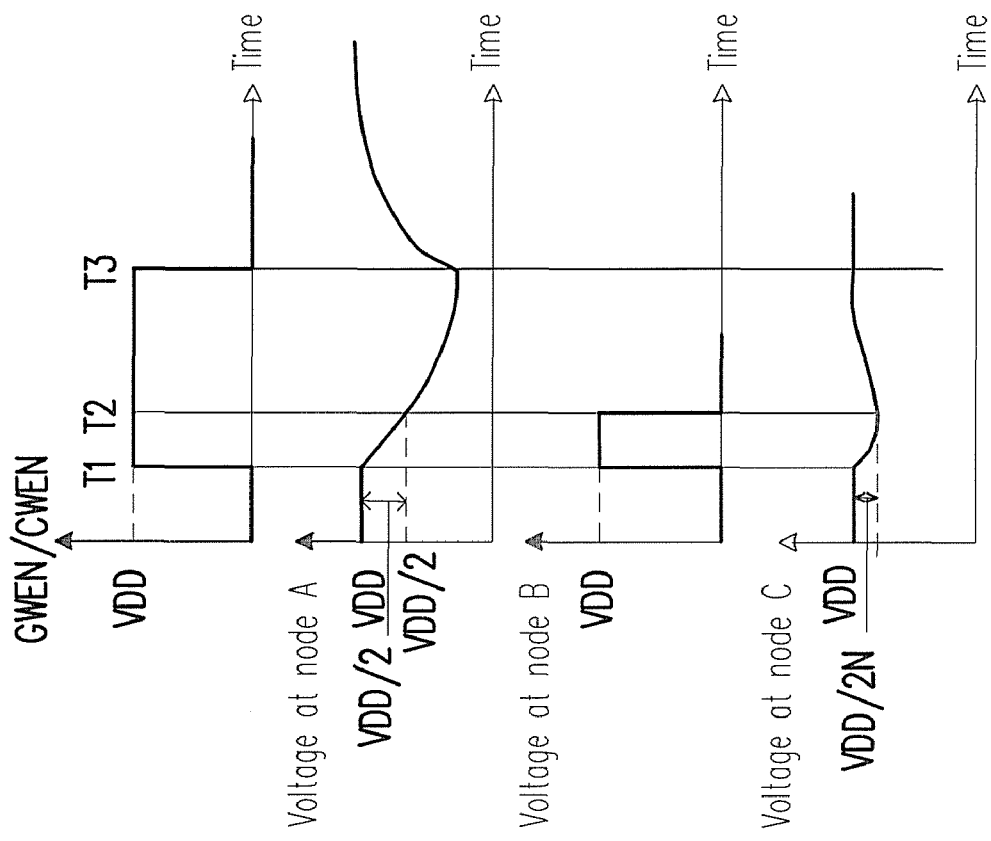
FIG. 9 is a signal timing diagram of the circuit of FIG. 8 during write operation.

FIG. 9 is a timing diagram of the global write enable signal GWEN and a column write enable signal CWEN during a write operation of the SRAM of the embodiment. FIG. 9 also shows the timings of the voltages at the nodes A, B and C in the circuit of FIG. 8. The voltage at the node A is the cell voltage of the tracking column 810; the voltage at the node B is the output voltage of the AND gate 830, i.e., the control voltage of the N-MOSFET N0; the voltage at the node C is the cell voltage of the normal column 810. The write operation course of the embodiment is explained as follows accompanying FIGS. 8 and 9.

First prior to a time point T1, the global write enable signal GWEN and the column write enable signal CWEN take a logic-low level VSS, the FETs PTK and P0 are turned on and the FETs NTK and N0 are turned off. At the time, the cell voltages of the tracking column 810 and the normal column 820 rise to VDD due to the operation voltage VDD.

Next the write operation starts at the time point T1, the global write enable signal GWEN and the column write enable signal CWEN rise from the logic-low level VSS to the logic-high level VDD at the time point T1 so as to turn off the FETs PTK and P0 and turn on the FET NTK. Since the voltage of the node A keeps the logic-high level and the column write enable signal CWEN has also risen to the logic-high level; therefore, the voltage at the output terminal B of the AND gate 830 rises to the logic-high level and the FET N0 is thereby turned on as well. Since the N-MOSFETs NTK and N0 are grounded at the time, the cell voltages of the tracking column 810 and the normal column 820 start dropping.

Then at the time point T12, the cell voltage of the tracking column 810 drops down to the output turning voltage VDD/2 of the AND gate 830, so that the output voltage of the normal column 820 is turned to the logic-low level, the FET N0 is turned off and the cell voltage of the normal column 820 ceases to drop. At the time point T2, the cell voltage of the normal column 820 reaches the lowest level, the write margin is the highest and the write operation is completed. Then at the time point T3, the global write enable signal GWEN and the column write enable signal CWEN drop down from the logic-high level to the logic-low level, so that the FETs PTK and P0 are turned on, the FET NTK is turned off and the circuit of FIG. 8 goes back to the initial state prior to the time point T1.

Figure 10:
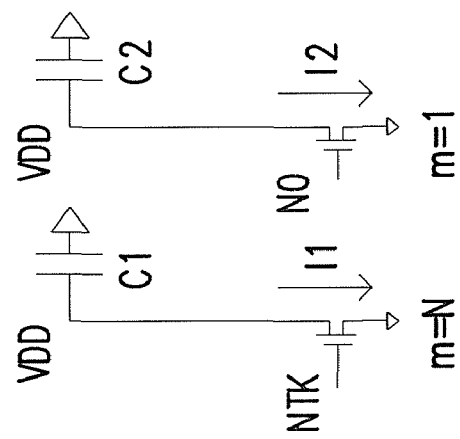
FIG. 10 is an equivalent circuit diagram of the circuit of FIG. 8 when the cell voltage is pulled down.

The amount of reduction of the cell voltage of the normal column 820 between the time points T1 and T2 is analyzed as follows. FIG. 10 is an equivalent circuit diagram of the circuit of FIG. 8 corresponding to reducing the cell voltages of the tracking column 810 and the normal column 820 between the time points T1 and T2, wherein C1 and C2 are respectively an equivalent capacitor of the cell power lines 811 and 821, I1 and I2 are the currents of the cell power lines 811 and 821. Assuming Q1 and Q2 respectively represent the charges stored in the capacitors C1 and C2, and U1 and U2 respectively represent the cell voltages of the tracking column 810 and the normal column 820, the relationships between the above-mentioned parameters are expressed by the following equations:

$$Q1 = C1 * U1$$

$$Q2 = C2 * U2$$

Assuming $T2 - T1 = \Delta T$, $\Delta U1$ and $\Delta U2$ respectively represent the amounts of reduction of U1 and U2; then, there are the following equations:

$$I1 * \Delta T = C1 * \Delta U1$$

$$I1 * \Delta T = C1 * (VDD - VDD/2)$$

$$I2*\Delta T=C2*\Delta U2$$

$$\Delta U2=(VDD-VDD/2)*I2/I1*C1/C2$$

Since the tracking column 810 tracking column 810 has the identical structure as that of the normal column 820, hence, C1=C2. In the embodiment, the current-driving capacity of the N-MOSFET NTK can be N times of the current-driving capacity of N0 (N is a predetermined positive integer) through a defined ratio of the gate widths or the gate aspect ratios between the FET NTK and the FET N0. Furthermore, it can be derived that I1=N*I2, and the following equation is obtained from the above-mentioned equations:

$$\Delta U2=VDD/2*1/N=VDD/2N$$

$\Delta U2$ in the above-mentioned equation is just the amount of reduction of the cell voltage of the normal column in the SRAM provided by the embodiment during a write operation. It can be seen that $\Delta U2$ is proportional to the operation voltage VDD. In other words, the amount of reduction of the cell voltage can be varied following the fluctuation of the operation voltage in a practical environment, so that the amount of reduction of the cell voltage is suitable for various operation voltage ranges. Since the tracking column has the identical structure as that of the normal column, the equivalent capacitors thereof are the same and can be counteracted by each other in deriving the amount of reduction of the cell voltage $\Delta U2$. In other words, $\Delta U2$ is unrelated to the equivalent capacitors and suitable for various lengths of the bit line. In particular, $\Delta U2$ is proportional to the operation voltage VDD with a predetermined ratio (1:2N). Therefore, $\Delta U2$ can be finely adjusted by adjusting the ratio of the current-driving capacities between the N-MOSFETs NTK and N0.

In other embodiments of the present invention, the ratio of the current-driving capacities between the N-MOSFETs NTK and N0 can be set as N1:N2, wherein N1 and N2 are predetermined positive integers. Hence, $\Delta U2:VDD=N2:2*N1$, so that a finer adjustment of $\Delta U2$ can be realized.

In other embodiments of the present invention, the AND gate 830 can be replaced by other detectors. The detector is coupled between the cell power line 811 and the FET N0, so that the FET N0 is turned on before the cell voltage of the tracking column 810 drops down to a predetermined voltage and is turned off after the cell voltage of the tracking column 810 drops down to the above-mentioned predetermined voltage. In order to track the fluctuation of the operation voltage VDD, the predetermined voltage is proportional to the operation voltage VDD with a predetermined ratio, for example, the predetermined voltage is VDD/2 sown in the above-mentioned embodiment.

Figure 11:
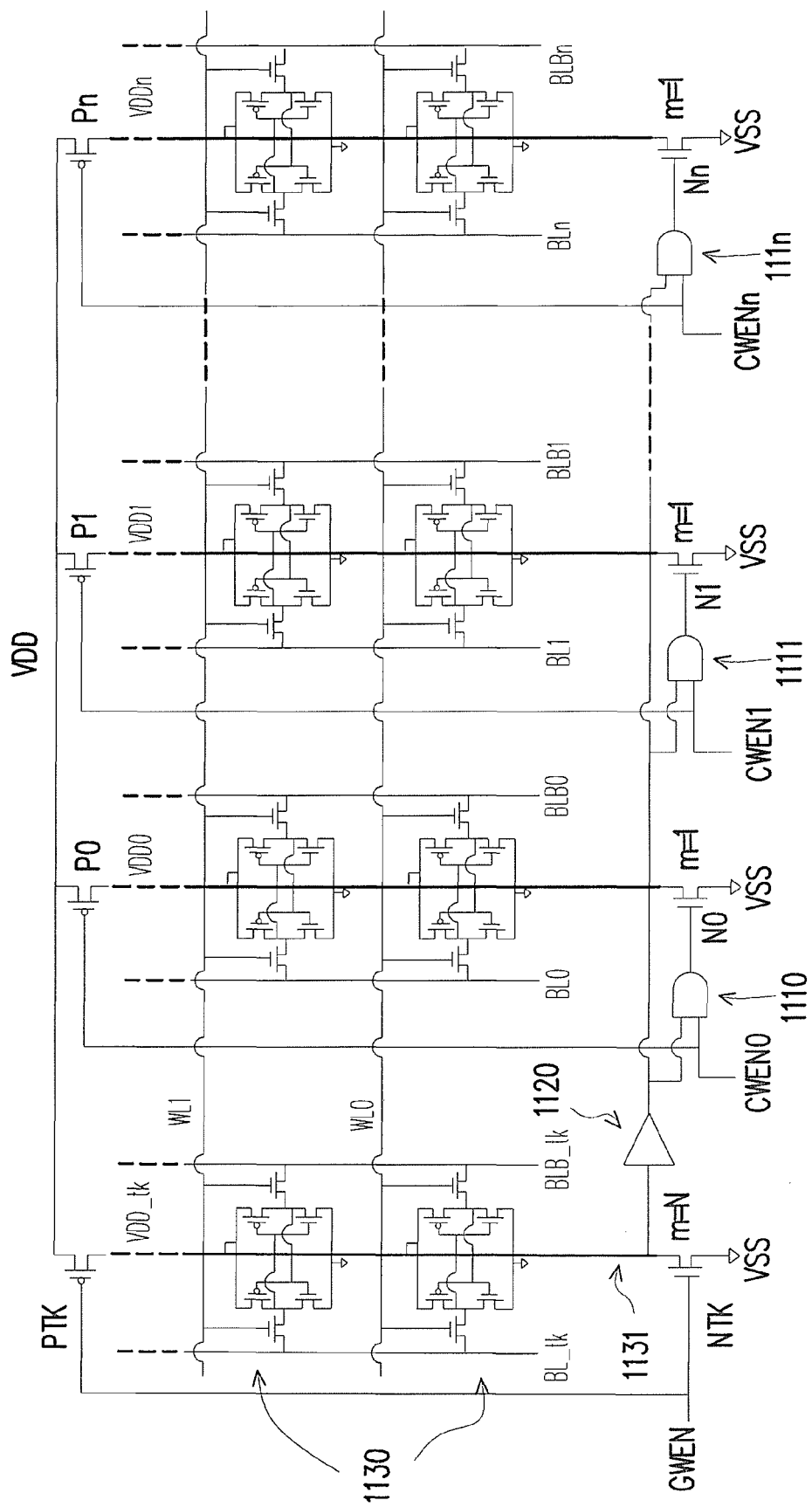
FIG. 11 is a schematic diagram of a partial circuit of an SRAM according to another embodiment of the present invention.

FIG. 11 is a diagram of a partial circuit of an SRAM according to another embodiment of the present invention. Referring to FIG. 11, the SRAM includes a plurality of memory cells, which form a plurality of columns. In FIG. 11, the most left column is a tracking column 1130, the rests are normal columns for storing bit data, and the tracking column and each of the normal columns have the identical structure.

The circuit of FIG. 11 is different from the circuit of FIG. 8 that the gates of the P-MOSFETs P0-Pn upper each normal column respectively receive the corresponding one of the column write enable signals CWEN0-CWENn for the normal columns, which is different from that in FIG. 8 where the gate of the P-MOSFET P0 receives the global write enable signal GWEN. Because in a circuit including a plurality of normal columns, normal columns usually are not enabled simultaneously, so the above-mentioned difference is introduced in FIG. 11; but the above-mentioned modification of the circuit of FIG. 11 does not affect any signal timing of FIG. 9.

Another difference of the circuit of FIG. 11 from the circuit of FIG. 8 rests in the circuit of FIG. 11 employs a buffer 1120. The buffer 1120 is respectively coupled between the cell power line 1131 of the tracking column 1130 and the AND gates 1111-111n below each normal column to increase the capacities of the tracking column 1130 for driving the AND gates 1111-111n.

Figure 12:
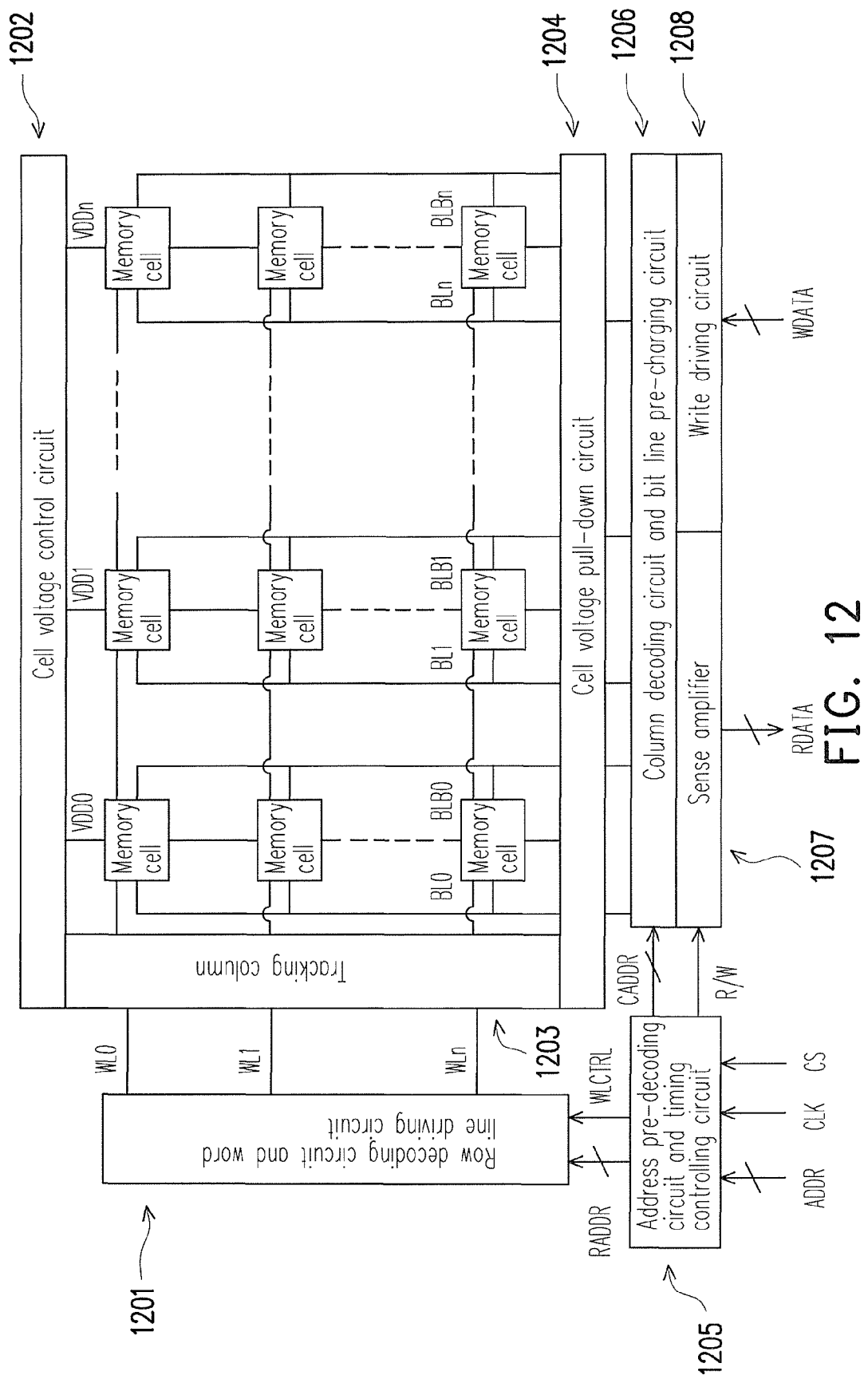
FIG. 12 is a schematic diagram of the circuit of an SRAM according to an embodiment of the present invention.

FIG. 12 is a diagram of a complete circuit of an SRAM according to another embodiment of the present invention. The circuit includes a row decoding circuit and word line driving circuit 1201, a cell voltage control circuit 1202, a tracking column 1203, memory cells of a plurality of normal columns, a cell voltage pull-down circuit 1204, an address pre-decoding circuit and timing controlling circuit 1205, a column decoding circuit and bit line pre-charging circuit 1206, a sense amplifier 1207 and a write driving circuit 1208.

The cell voltage control circuit 1202 functions similarly to the P-MOSFETs PTK and P0-Pn in FIG. 8 or the P-MOSFETs PTK and P0-Pn in FIG. 11. The cell voltage control circuit 1202 connects the operation voltage VDD to the tracking column 1203 and the normal columns conducting the write operation before the write operation of the SRAM starts. In addition, the cell voltage control circuit 1202 disconnects the operation voltage VDD from the tracking column 1203 and the normal columns conducting the write operation after the write operation starts.

The cell voltage pull-down circuit 1204 functions similarly to the N-MOSFETs NTK and N0 and the AND gate 830 in FIG. 8 or the N-MOSFETs NTK and N0-Nn, the AND gates 1111-111n and the buffer 1120 in FIG. 11. The cell voltage pull-down circuit 1204 pulls down the cell voltages of the tracking column 1203 and the normal columns conducting the write operation after the write operation starts and ceases pulling down the cell voltages of the normal columns conducting the write operation when the cell voltage of the tracking column 1203 drops down to the above-mentioned predetermined voltage.

The address pre-decoding circuit and timing controlling circuit 1205 is in charge of receiving addresses ADDR, a clock signal CLK and a chip selection signal CS so as to decode the received addresses ADDR into row addresses RADDR and column addresses CADDR and to control the signal timing of the SRAM. The row decoding circuit and word line driving circuit 1201 receives the row addresses RADDR and a word line controlling signal WLCTRL so as to select one of the rows of the SRAM according to the row address RADDR for conducting a read/write operation. The column decoding circuit and bit line pre-charging circuit 1206 receives column addresses CADDR and a writing controlling signal R/W so as to select one of the columns of the SRAM according to the column address CADDR for conducting a read/write operation. If the present operation is a read operation, the column decoding circuit and bit line pre-charging circuit 1206 would pre-charge a selected pair of bit lines to the level of VDD. The sense amplifier 1207 is for amplifying the voltages of the bit lines during a read operation and outputting the data RDATA read from the memory cells. The write driving circuit 1208 is for receiving the input data WDATA for a write operation and writing WDATA into the selected memory cells.

In summary, the present invention employs a tracking column with the identical structure of the normal columns so as to reduce the memory cell voltage during a write operation. The present invention is able to increase the write margin of the SRAM and suits memory architectures with various column lengths and the various operation voltage ranges, wherein the amount of reduction of the cell voltage can be precisely controlled. In addition, since the tracking column is a replica of the normal column, the present invention can eliminate the negative influence caused by the variation of the global process parameters. The present invention is also advantageous in layout and circuit simplicities. In particular, the present invention utilizes the original control signals of the SRAM (the global write enable signal and the column write enable signal) without adding extra signal timing or modifying the current operation timing and does not affect the read/write speed of the SRAM.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A static random access memory, comprising:
   a tracking column, comprising a plurality of first memory cells;
   a normal column, comprising a plurality of second memory cells;
   a cell voltage control circuit, coupled to the tracking column and the normal column for connecting an operation voltage to the tracking column and the normal column before a write operation of the static random access memory starts and for disconnecting the operation voltage from the tracking column and the normal column after the write operation starts; and
   a cell voltage pull-down circuit, coupled to the tracking column and the normal column for pulling down cell voltages of the tracking column and the normal column after the write operation starts and for ceasing pulling down the cell voltage of the normal column when the cell voltage of the tracking column drops down to a predetermined voltage, wherein the cell voltage control circuit connects the operation voltage ad the tracking column according to a global write enable signal, and the cell voltage control circuit connects the operation voltage and the normal column according to a column write enable signal.

2. The static random access memory according to claim 1, wherein the tracking column comprises a first cell power line, the cell voltage of each of the first memory cells is received from the first cell power line, the normal column comprises a second cell power line, the cell voltage of each of the second memory cells is received from the second cell power line, the cell voltage control circuit is coupled to the first cell power line and the second cell power line, and the cell voltage pull-down circuit is also coupled to the first cell power line and the second cell power line.

3. The static random access memory according to claim 1, wherein the tracking column and the normal column have an identical structure.

4. The static random access memory according to claim 1, wherein the first switch and the second switch are p-channel metal oxide semiconductor field effect transistors, and the global write enable signal rises from a logic-low level to a logic-high level when the write operation starts.

5. The static random access memory according to claim 1, wherein the cell voltage control circuit comprises:
   a first switch, coupled between the operation voltage and the tracking column to be turned on or turned off according to the global write enable signal; and
   a second switch, coupled between the operation voltage and the normal column to be turned on or turned off according to the column write enable signal.

6. The static random access memory according to claim 5, wherein the first switch and the second switch are p-channel metal oxide semiconductor field effect transistors, and the global write enable signal and the column write enable signal rise from a logic-low level to a logic-high level when the write operation starts.

7. The static random access memory according to claim 1, wherein the cell voltage pull-down circuit comprises:
   a third switch, coupled between the tracking column and a ground voltage to be turned on or turned off according to the global write enable signal;
   a fourth switch, coupled between the normal column and the ground voltage; and
   a detector, coupled between the tracking column and the fourth switch to turn on or turn off the fourth switch according to the cell voltage of the tracking column.

8. The static random access memory according to claim 7, wherein the predetermined voltage is proportional to the operation voltage with a predetermined ratio.

9. The static random access memory according to claim 7, wherein the current-driving capacity of the third switch is proportional to the current-driving capacity of the fourth switch with a predetermined ratio.

10. The static random access memory according to claim 7, wherein the third switch and the fourth switch are N-channel metal oxide semiconductor field effect transistors, and the global write enable signal rises from a logic-low level to a logic-high level when the write operation starts.

11. The static random access memory according to claim 7, wherein the detector turns on the fourth switch before the cell voltage of the tracking column drops down to the predetermined voltage and turns off the fourth switch after the cell voltage of the tracking column drops down to the predetermined voltage.

12. The static random access memory according to claim 7, wherein the detector is an AND gate and comprises:
   a first input terminal, coupled to the tracking column for receiving the cell voltage of the tracking column;
   a second input terminal for receiving a column write enable signal; and
   an output terminal, coupled to the fourth switch for turning on or turning off the fourth switch.

13. The static random access memory according to claim 12, wherein the predetermined voltage is the output inverting voltage of the AND gate.

14. The static random access memory according to claim 7, wherein the cell voltage pull-down circuit further comprises:
   a buffer, coupled between the tracking column and the detector for increasing driving capacity of the cell voltage of the tracking column.

15. A method of forming a static random access memory, comprising:
   providing a tracking column comprising a plurality of first memory cells;
   providing a normal column comprising a plurality of second memory cells;
   providing a cell voltage control circuit and coupling the cell voltage control circuit to the tracking column and the normal column for connecting an operation voltage to the tracking column and the normal column before a write operation of the static random access memory starts and for disconnecting the operation voltage from the tracking column and the normal column after the write operation starts;

providing a first switch in the cell voltage control circuit, wherein the first switch is coupled between the operation voltage and the tracking column to be turned on or turned off according to a global write enable signal;

providing a second switch in the cell voltage control circuit, wherein the second switch is coupled between the operation voltage and the normal column to be turned on or turned off according to a column write enable signal; and providing a cell voltage pull-down circuit and coupling the cell voltage pull-down circuit to the tracking column and the normal column for pulling down the cell voltages of the tracking column and the normal column after the write operation starts and for ceasing pulling down the cell voltage of the normal column when the cell voltage of the tracking column drops down to a predetermined voltage.

16. A method of controlling a static random access memory, wherein the static random access memory comprises at least a first column and a second column, each of the first column and the second column comprises at least a memory cell and each of the memory cells operates according to a corresponding cell voltage; the method comprising:

disconnecting the cell voltage of each memory cell in the first column from an operation voltage by the first switch according to the global write enable signal so that the cell voltage of each memory cell in the first column starts changing, meanwhile disconnecting each memory cell in the second column from the operation voltage by the second switch according, to the column write enable signal so that the cell voltage of each memory cell in the second column starts changing.

17. The method of controlling the static random access memory according to claim 16, further comprising:

controlling the variation of the cell voltage of each memory cell in the second column according to the variation of the cell voltage of each memory cell in the first column when the cell voltage of each memory cell in the second column starts changing.

* * * * *